United States Patent
Liu et al.

(10) Patent No.: US 10,803,924 B2
(45) Date of Patent: *Oct. 13, 2020

(54) INTERNAL WRITE LEVELING CIRCUITRY

(71) Applicant: Micron Technology, Inc., Boise, ID (US)

(72) Inventors: Ming-Bo Liu, Plano, TX (US); Daniel B. Penney, Wylie, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/514,819

(22) Filed: Jul. 17, 2019

(65) Prior Publication Data

US 2019/0392888 A1    Dec. 26, 2019

Related U.S. Application Data

(63) Continuation of application No. 16/014,539, filed on Jun. 21, 2018, now Pat. No. 10,418,090.

(51) Int. Cl.
*G11C 11/4076* (2006.01)
*G11C 11/4093* (2006.01)
*G11C 11/4096* (2006.01)

(52) U.S. Cl.
CPC ...... *G11C 11/4076* (2013.01); *G11C 11/4093* (2013.01); *G11C 11/4096* (2013.01)

(58) Field of Classification Search
CPC ............ G11C 11/4076; G11C 11/4093; G11C 11/4096
See application file for complete search history.

(56) References Cited

U.S. PATENT DOCUMENTS

| | | | | |
|---|---|---|---|---|
| 6,081,477 A * | 6/2000 | Li | ........................ | G11C 7/1066 365/189.02 |
| 7,196,948 B1 * | 3/2007 | Vemula | ................ | G11C 7/1051 365/189.15 |
| 7,990,781 B1 * | 8/2011 | Venkataraman | .... | G06F 13/1689 365/193 |
| 8,441,888 B2 * | 5/2013 | Bringivijayaraghavan | ................ | G11C 7/1078 365/230.06 |
| 8,737,161 B1 * | 5/2014 | Kumar | ..................... | G11C 5/04 365/233.1 |
| 8,867,301 B2 * | 10/2014 | Shido | ........................ | G11C 8/10 365/194 |
| 9,601,170 B1 * | 3/2017 | Mazumder | ........... | G11C 7/1087 |

(Continued)

OTHER PUBLICATIONS

International Search Report and Written Opinion for PCT/US2019/020785 dated Jun. 19, 2019, 9 pages.

*Primary Examiner* — Mushfique Siddique
(74) *Attorney, Agent, or Firm* — Fletcher Yoder, P.C.

(57) ABSTRACT

Systems and methods include capture circuitry configured to capture a write signal from a host device using a data strobe signal from the host device and to output one or more indications of capture of the write signal. Calculation circuitry is configured to receive the data strobe signal, receive the one or more indications of capture, and determine a delay between a first edge of the data strobe signal and receipt of the one or more indications of capture. The systems and methods also include transmission and control circuitry configured to launch subsequent write signals at a time based at least in part on the delay.

18 Claims, 5 Drawing Sheets

(56) References Cited

U.S. PATENT DOCUMENTS

| | | | |
|---|---|---|---|
| 10,148,269 B1* | 12/2018 | Mazumder | G11C 11/4087 |
| 10,153,014 B1* | 12/2018 | Mazumder | G11C 29/022 |
| 10,157,659 B1* | 12/2018 | Venkata | G11C 7/1078 |
| 10,176,862 B1* | 1/2019 | Penney | G11C 7/1093 |
| 10,297,310 B2* | 5/2019 | Prakash | G11C 8/18 |
| 10,418,090 B1* | 9/2019 | Liu | G11C 11/4096 |
| 2002/0001234 A1* | 1/2002 | Merritt | G11C 11/407 365/189.05 |
| 2004/0052151 A1* | 3/2004 | Jacobs | G06F 13/4243 365/233.13 |
| 2004/0133757 A1* | 7/2004 | Rentschler | G06F 13/1689 711/167 |
| 2005/0050375 A1* | 3/2005 | Novak | G06F 13/4243 713/600 |
| 2007/0028060 A1* | 2/2007 | Ware | G11C 5/14 711/154 |
| 2007/0147142 A1* | 6/2007 | Schnell | G11C 7/1027 365/191 |
| 2007/0171735 A1* | 7/2007 | Oh | G11C 11/4076 365/189.12 |
| 2007/0230266 A1* | 10/2007 | Kao | G11C 7/1051 365/189.16 |
| 2008/0201597 A1* | 8/2008 | Chong | G11C 7/1066 713/401 |
| 2008/0259696 A1* | 10/2008 | Merritt | G06F 12/0638 365/189.05 |
| 2009/0072871 A1* | 3/2009 | Tokuhiro | H03L 7/0814 327/158 |
| 2009/0077411 A1* | 3/2009 | Tokuhiro | G11C 7/1093 713/601 |
| 2009/0091987 A1* | 4/2009 | Butt | G11C 7/1006 365/189.05 |
| 2009/0161453 A1* | 6/2009 | Giovannini | G11C 7/1087 365/193 |
| 2009/0296495 A1* | 12/2009 | Choi | G11C 7/22 365/189.05 |
| 2010/0008176 A1* | 1/2010 | Swain | G11C 7/10 365/233.1 |
| 2010/0070690 A1* | 3/2010 | Amer | G11C 7/1072 711/103 |
| 2010/0208534 A1* | 8/2010 | Fujisawa | G11C 29/02 365/193 |
| 2010/0208535 A1* | 8/2010 | Fujisawa | G11C 11/4076 365/193 |
| 2010/0246291 A1* | 9/2010 | Espinoza | G11C 8/18 365/193 |
| 2010/0254198 A1* | 10/2010 | Bringivijayaraghavan | G11C 7/10 365/189.05 |
| 2010/0293406 A1* | 11/2010 | Welker | G06F 13/1689 713/401 |
| 2011/0016282 A1* | 1/2011 | Gillingham | G11C 7/1066 711/167 |
| 2011/0047319 A1* | 2/2011 | Jeon | G06F 13/4243 711/103 |
| 2011/0085392 A1* | 4/2011 | Truong | G11C 7/1066 365/193 |
| 2011/0291719 A1* | 12/2011 | Ok | H03L 7/0814 327/158 |
| 2012/0081144 A1* | 4/2012 | Song | G11C 7/222 326/30 |
| 2012/0120745 A1* | 5/2012 | Miyano | G11C 11/4063 365/193 |
| 2012/0131304 A1* | 5/2012 | Franceschini | G06F 12/0246 711/202 |
| 2012/0137084 A1* | 5/2012 | Ok | G11C 7/1093 711/154 |
| 2012/0176850 A1* | 7/2012 | Do | G11C 8/18 365/193 |
| 2012/0206181 A1* | 8/2012 | Lin | H03K 5/14 327/199 |
| 2012/0307575 A1* | 12/2012 | Aiso | G11C 29/028 365/189.15 |
| 2013/0117599 A1* | 5/2013 | Mochida | G11C 11/4076 713/503 |
| 2013/0346684 A1* | 12/2013 | Bains | G11C 7/109 711/105 |
| 2014/0119141 A1* | 5/2014 | Tamlyn | G11C 7/222 365/193 |
| 2014/0229668 A1* | 8/2014 | Oda | G11C 7/1072 711/105 |
| 2014/0279759 A1* | 9/2014 | Yang | G11C 29/022 706/12 |
| 2014/0313837 A1* | 10/2014 | Kwak | G11C 7/222 365/189.05 |
| 2014/0321229 A1* | 10/2014 | Duffner | G11C 7/1009 365/233.13 |
| 2014/0334243 A1* | 11/2014 | Duffner | G11C 29/022 365/233.13 |
| 2014/0355359 A1* | 12/2014 | Linam | H04L 7/0041 365/189.02 |
| 2015/0206560 A1* | 7/2015 | Kang | G11C 29/022 711/103 |
| 2015/0248926 A1* | 9/2015 | Giovannini | G11C 7/1078 365/193 |
| 2015/0263739 A1* | 9/2015 | Jung | G11C 7/1057 327/149 |
| 2015/0340072 A1* | 11/2015 | Mazumder | G11C 7/1093 365/189.05 |
| 2017/0140808 A1* | 5/2017 | Jung | G11C 7/227 |
| 2017/0287546 A1* | 10/2017 | Ryu | G11C 7/1066 |
| 2018/0012638 A1* | 1/2018 | Kang | G11C 7/225 |
| 2018/0053538 A1* | 2/2018 | Miyano | G11C 7/1084 |
| 2018/0083764 A1* | 3/2018 | Dhakshinamurthy | H04L 7/0008 |
| 2018/0151207 A1* | 5/2018 | Kondo | G11C 7/1039 |
| 2018/0351560 A1* | 12/2018 | Qi | G11C 7/222 |
| 2019/0096451 A1* | 3/2019 | Mazumder | G11C 11/4063 |
| 2019/0121577 A1* | 4/2019 | Mazumder | G11C 29/023 |
| 2019/0164583 A1* | 5/2019 | Penney | G11C 7/1096 |
| 2019/0164593 A1* | 5/2019 | Penney | G11C 11/4093 |
| 2019/0206478 A1* | 7/2019 | Jun | G11C 11/4093 |

* cited by examiner

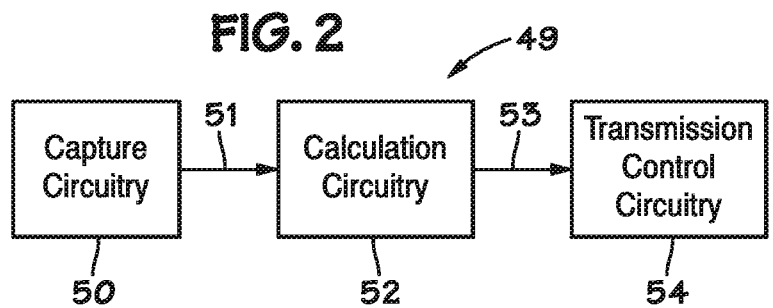
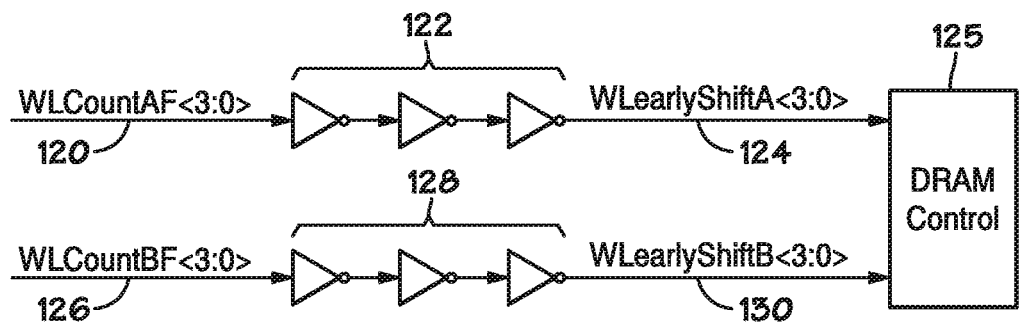
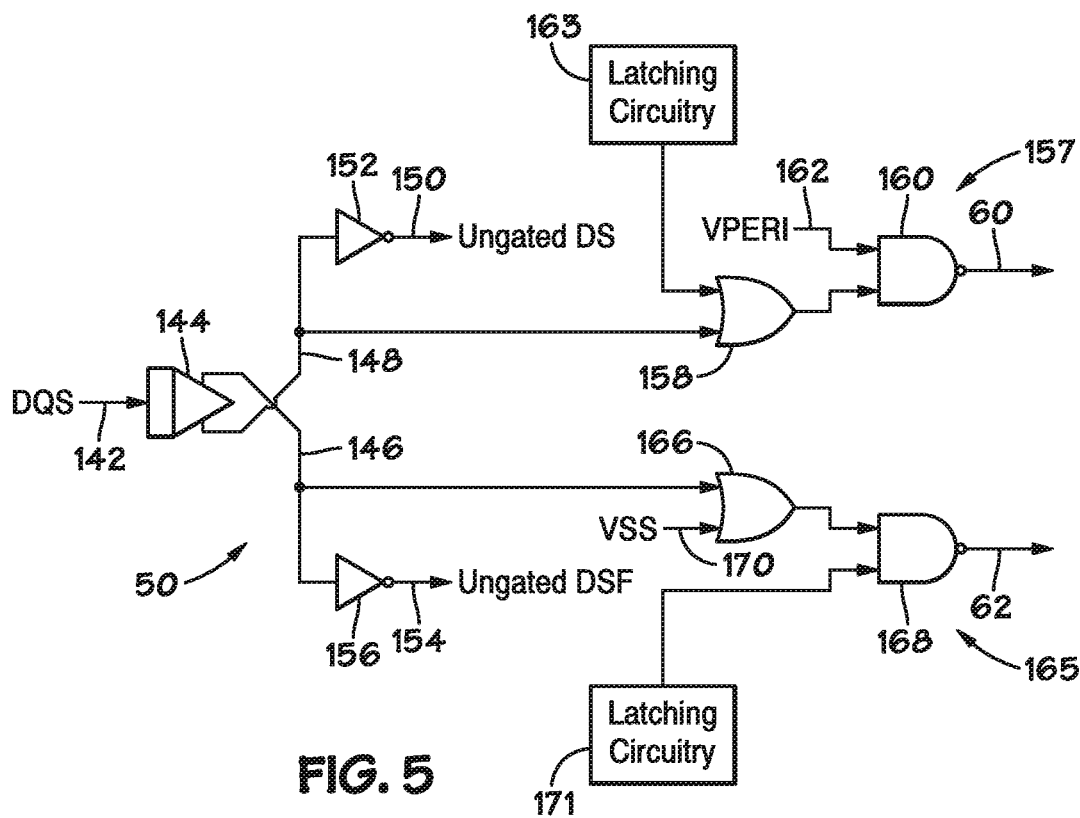

US 10,803,924 B2

INTERNAL WRITE LEVELING CIRCUITRY

CROSS REFERENCE TO RELATED APPLICATION

This application is a continuation of U.S. application Ser. No. 16/014,539, filed on Jun. 21, 2018, entitled "INTERNAL WRITE LEVELING CIRCUITRY," the contents of which is herein expressly incorporated by reference for all purposes.

BACKGROUND

Field of the Present Disclosure

Embodiments of the present disclosure relate generally to the field of semiconductor devices. More specifically, embodiments of the present disclosure relate to internally determining when to launch an internal write signal using internal write leveling in memory devices.

Description of Related Art

Semiconductor devices (e.g., memory devices) utilize timing with phase shifts of data signals, data strobes, and/or other signals to perform operations. Data strobes are used to capture data. To ensure that the data strobe signals are timed properly to capture data signals in, write leveling may be used to adjust timing for the data strobe signals to ensure that the data signals are captured properly.

Embodiments of the present disclosure may be directed to one or more of the problems set forth above.

BRIEF DESCRIPTION OF DRAWINGS

FIG. 2 is a block diagram of the IWS circuitry of FIG. 1 that includes calculation circuitry, transmission and control circuitry, and capture circuitry, in accordance with an embodiment;

FIG. 4 is a schematic diagram of the transmission and control circuitry of FIG. 2, in accordance with an embodiment;

FIG. 5 is a schematic diagram of the capture circuitry of FIG. 2 including first and second latching circuitries, in accordance with an embodiment;

DETAILED DESCRIPTION

Figure 1:
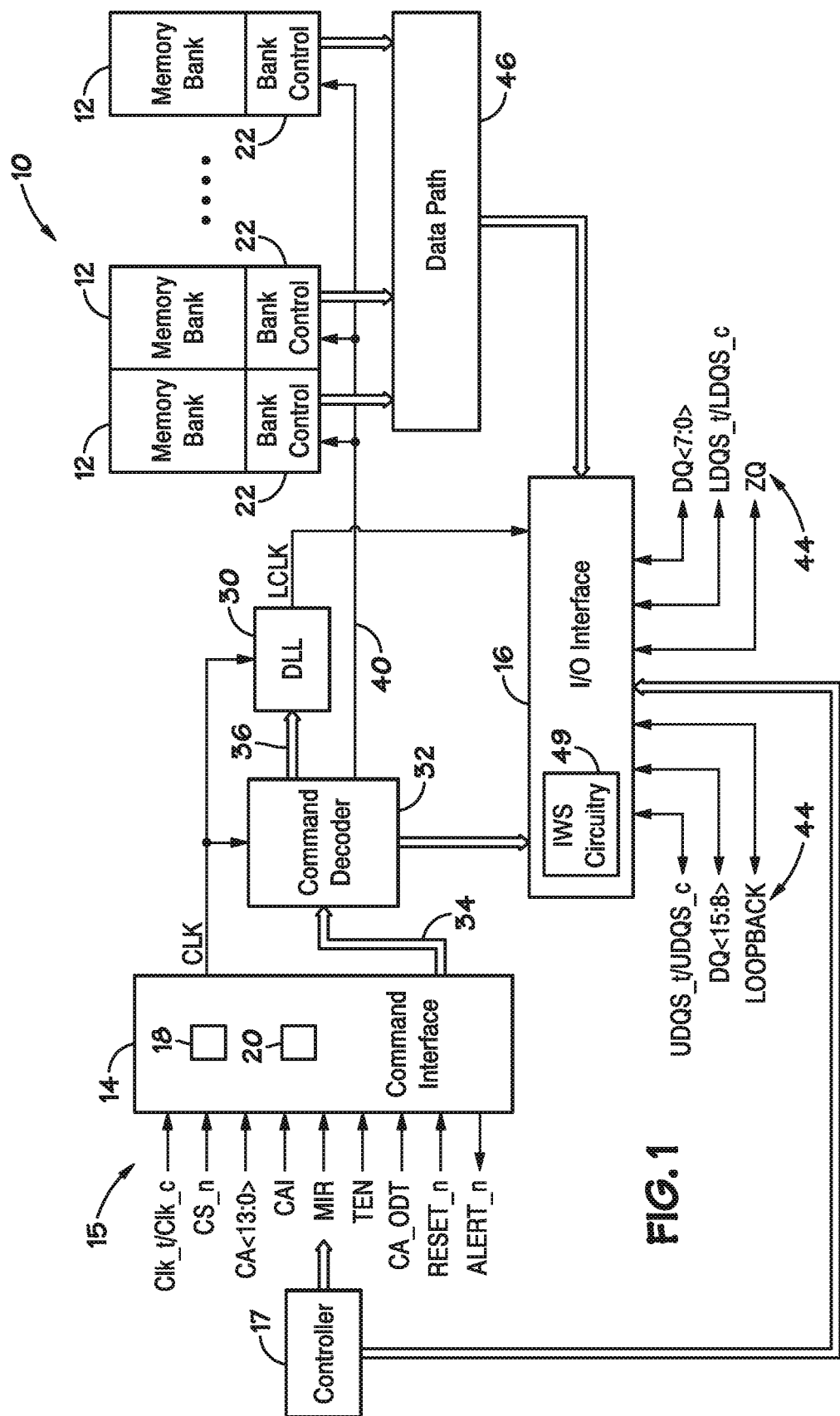
FIG. 1 is a simplified block diagram illustrating certain features of a memory device having internal write signal (IWS) circuitry, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously noted, to ensure that the data strobe (DQS) signals are timed properly to capture data signals (DQ), write leveling may be used to adjust the DQS signals. During write leveling the DQS signals are driven by a controller on a cas write latency (CWL) count whereas, during a normal write operation, DQS signals may have long preamble times to avoid confusion where a first rising edge of the DQS is located. In some embodiments, write leveling may be employed at powerup of a memory device, during a clock change, and/or due to system-level decisions (e.g., when too much variation occurs on clocking and clocking is reset). Write leveling may be classified as external write leveling and/or internal write leveling. External write leveling includes sending signals back to a host device telling the host device whether the DQS signals were able to be used to capture DQ signals. If the DQS signals do not enable proper capture of the DQ signals, the host device may shift the DQS signals until the DQS signals are able to capture the DQ signals.

Internal write leveling is performed entirely in the memory device independent of interactions with the host device. As discussed below, internal write leveling utilizes internal write signal (IWS) circuitry to launch the IWS to occur some number (N) of cycles earlier than a programmed CAS Write Latency (CWL) for the memory device to ensure that the internal DQS signal may capture the IWS properly. The DQS signal is inherently much faster than the IWS. Thus, the IWS circuitry launches the IWS earlier than the CWL. For example if CWL is programmed to 28 cycles, then the IWS would nominally be launched 28 cycles after the external write command enters the memory device. However, without adjustment, the IWS may be late with respect to the internal DQS signal that captures the IWS. Thus, as described below, the IWS is released early as calculated by the IWS circuitry. Alternatively, the internal DQS signal may be artifically delayed to match the IWS, but this artificial delay may increase power consumption in the memory device relative to the implementation that launches the IWS earlier than the CWL rather than delaying the internal DQS signal. In some embodiments, the early launching of the IWS may be performed internally to the memory device using the IWS circuitry.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a DDR5 SDRAM device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device, such as a controller 17 that may be embodied as a processor and/or other host device. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the bar clock signal (Clk_c). The positive clock edge for DDR refers to the point where the rising true clock signal Clk_t crosses the falling bar clock signal Clk_c, while the negative clock edge indicates that transition of the falling true clock signal Clk_t and the rising of the bar clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the bar clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving signals 44 (e.g., data and/or strobes to capture the data) through the IO interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a ×16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

The DQS signals are driven by the controller 17 to the memory device 10 to strobe in write data. When the write operation is complete, the controller 17 will stop driving the DQS and allow it to float to an indeterminate tri-state condition. To ensure that the DQS signals are timed properly to capture DQ signals in the memory device 10, write leveling may be used to adjust the DQS signals. In some embodiments, write leveling may be employed at powerup of the memory device 10, during a clock change, and/or due to system-level decisions (e.g., when too much variation occurs on clocking and clocking is reset). Write leveling may be divided into external write leveling and internal write leveling. External write leveling includes the memory device 10 sending signals back to the controller 17 telling the controller 17 whether the DQS signals were able to be used to capture DQ signals. If not, the controller 17 may shift the DQS signals until the DQS signals are able to capture the DQ signals.

Internal write leveling is performed entirely on the memory device 10 without interference from the controller 17. Internal write leveling utilizes IWS circuitry 49 to launch the IWS to occur some number (N) of cycles earlier than the programmed CWL for the memory device 10 to ensure that the internal DQS signal may capture the IWS. The DQS signal is inherently much faster than the IWS. Thus, the IWS circuitry 49 launches the IWS earlier than the CWL. For example if CWL is programmed to 28 cycles, then the IWS would nominally be launched 28 cycles after the external write command enters the memory device. However, without adjustment, the IWS may be late with respect to the internal DQS signal that captures the IWS. Thus, as described below, the IWS is released early using determinations from the IWS circuitry 49. Alternatively, the internal DQS signal may be artifically delayed to match the IWS, but this artificial delay may increase power consumption in the memory device 10 relative to an implementation that launches the IWS earlier than the CWL. In some embodiments, the early launching of the IWS may be performed internally to the memory device 10 using the IWS circuitry 49.

Returning to FIG. 1, an impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

FIG. 2 illustrates a block diagram of an embodiment of the IWS circuitry 49 that includes capture circuitry 50 that captures the IWS and sends one or more indications 51 to calculation circuitry 52 that tracks how many cycles occur between DQS propagating through the memory device 10 to the IWS circuitry and IWS being captured by the capture circuitry 50. The calculation circuitry 52 sends one or more indications 53 to transmission and control circuitry 54 that transmits the N number of cycles to control logic in the memory device 10 that indicates that the IWS is to be launched N number of cycles earlier than the CWL.

Figure 3:
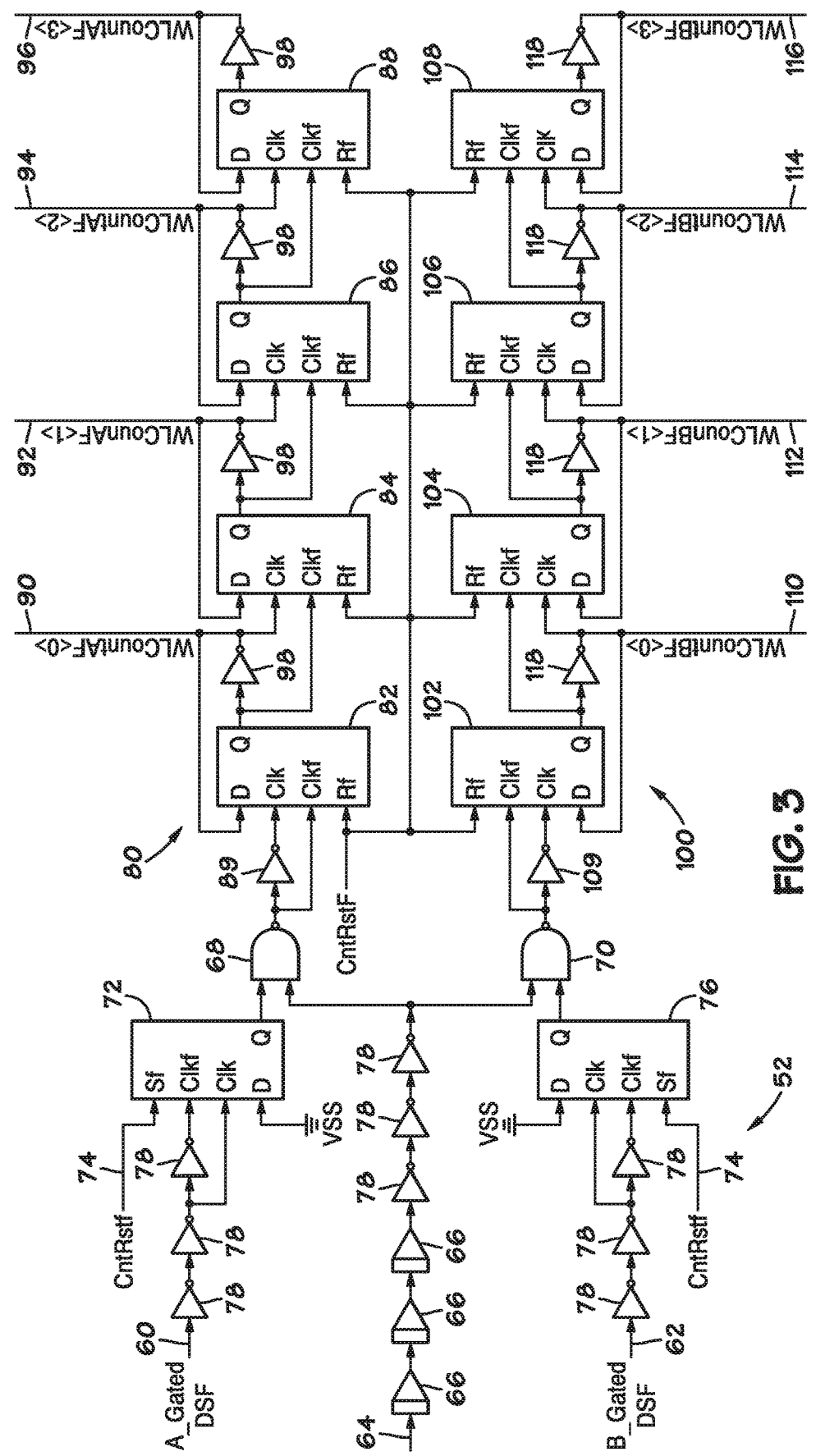
FIG. 3 is a schematic diagram of the calculation circuitry of FIG. 2, in accordance with an embodiment.

FIG. 3 illustrates a schematic diagram of an embodiment of the calculation circuitry 52 that receives an A_GatedDSF signal 60 and a B_GatedDSF signal 62 as indications 51 of whether the IWS has been captured by the capture circuitry 50. Two indications 51 are used to detect whether the IWS is captured at a verge of failure to capture for a DQS cycle since the two indications 51 are generated using different outputs of an input buffer and use different logic to accommodate the different outputs. In some embodiments, only a single indication 51 is used, or more than two indications 51 are used. The calculation circuitry 52 also receives an ungated DQS signal 64. For example, the ungated DQS signal 64 may be an internal DQS true signal or an internal DQS bar signal. Before the A_GatedDSF signal 60 and the B_GatedDSF signal 62 transition, NAND gates 68 and 70 enable toggling of the ungated DQS signal 64 to pass through. However, when the A_GatedDSF signal 60 transitions as an indication that an IWS has been captured, a flip-flop 72 outputs a high signal when the A_GatedDSF signal 60 clocks VSS into the flip-flop 72. The high signal out of the flip-flop 72 stops the ungated DQS signal 64 from toggling through the NAND gate 68. This flip-flop 72 may be set using a CntRstf signal 74 that sets up the flip-flop 72 to output a low signal that enables the NAND gate 68 to toggle through the ungated DQS signal 64 until the A_GatedDSF signal 60 transitions. For example, the CntRstf signal 74 may be used to set the flip-flop 72 when the memory device 10 is powered on. The calculation circuitry 52 may also include one or more inverters 78 that are included to provide appropriate signal polarities, amplification of signals, timing, and/or change other properties of the A_GatedDSF signal 60.

In the illustrated embodiment, a flip-flip 76 is used to gate the B_GatedDSF signal 62 similar to the way the flip-flop 72 is used to gate the A_GatedDSF signal 60. Both paths are made available to capture the IWS so that IWSs occurring at or near a boundary of the DQS may be properly captured. If one path captures the IWS and the other does not, the IWS may be deemed as near the boundary of a DQS pulse. As discussed below, this boundary condition may be accommodated in the memory device 10 using fine-tuning. In some embodiments, only one path (e.g., A_GatedDSF signal 60) is included in the memory device 10 by ignoring boundary detection. The calculation circuitry 52 may also include one or more inverters 78 that are included to provide appropriate signal polarities, amplification of signals, timing, and/or change other properties of the B_GatedDSF signal 62.

The output of the NAND gate 68 is passed to a counter 80. Although the illustrated embodiment of the counter 80 is a 4-bit counter, in some embodiments, the number of bits in the counter may be any suitable number of bits. Furthermore, in some embodiments, the counter 80 may include any other suitable type of counter (e.g., synchronous counter). In the illustrated embodiment, the counter 80 includes flip-flops 82, 84, 86, and 88. The flip-flop 82 is clocked using the output of the NAND gate 68 that is used to generate differential clocking for the flip-flop 82 via an inverter 89. The flip-flops 84, 86, and 88 are clocked using respective previous flip-flops 82, 84, and 86 as a ripple counter. Each flip-flop 82, 84, 86, and 88, based on the number of toggles of the output of the NAND gate 68, outputs a respective signal: WLcountAF<0> signal 90, WLcountAF<1> signal 92, WLcountAF<2> signal 94, or WLcountAF<3> signal 96. When each flip-flop 82, 84, 86, and 88 receives a pulse from an adjacent flip-flop output, it clocks an inversion of its previous output using an inverter 98.

As previously noted, the flip-flop 76 works similar to the flip-flop 72. Specifically, the flip-flop 76 may be set to output a low value using the CntRstf signal 74 until the B_GatedDSF signal 62 clocks VSS into the flip-flop 76. In other words, in the set state, the flip-flop 76 outputs a low value to enable toggling of the ungated DQS signal 64 through the NAND gate 70 until a transition of the B_GatedDSF signal 62 stops the toggling.

When a second path is used in the calculation circuitry 52, the calculation circuitry includes a counter 100 that functions similarly to the counter 80 except that the counter 100 is used to count toggles before being stopped by the B_GatedDSF signal 62. Specifically, the output of the NAND gate 70 is passed to the counter 100. Although the illustrated embodiment of the counter 100 is a 4-bit counter, in some embodiments, the number of bits in the counter may be any suitable number of bits. Furthermore, in some embodiments, the counter 100 may include any other suitable type of counter (e.g., synchronous counter). In the illustrated embodiment, the counter 100 includes flip-flops 102, 104, 106, and 108. The flip-flop 102 is clocked using the output of the NAND gate 70 that is used to generate differential clocking for the flip-flop 102 via an inverter 109. The flip-flops 104, 106, and 108 are clocked using respective previous flip-flops 102, 104, and 106. Each flip-flop 102, 104, 106, and 108, based on the number of toggles of the output of the NAND gate 70, outputs a respective signal: WLcountBF<0> signal 110, WLcountBF<1> signal 112, WLcountBF<2> signal 114, or WLcountBF<3> signal 116. When each flip-flop 102, 104, 106, and 108 is clocked by an adjacent flip-flop, it clocks in an inverted previous output using inverters 118.

FIG. 4 illustrates a schematic diagram of the transmission and control circuitry 54 that receives a WLcountAF<3:0> signals 120 and passes it through one or more amplifiers/inverters 122 to generate a WLearlyShiftA<3:0> signal 124 that is passed to DRAM control circuitry 125. The transmission and control circuitry 54 also receives a WLcountBF<3:0> signal 126 and passes it through one or more amplifiers/inverters 126 to generate a WLearlyShiftB<3:0> signal 130 that is passed to the DRAM control circuitry 125. The DRAM control circuitry 125 compares the values and determines how to launch the IWS. Specifically, if both counted values are the same in the WLearlyShiftA<3:0> signal 124 and the WLearlyShiftB<3:0> signal 130, the counted value is set as N, and the IWS is launched at CWL-N cycles. However, if the counted values in WLearlyShiftA<3:0> signal 124 and the WLearlyShiftB<3:0> signal 130 are different, the DRAM control circuitry 125 deems that the capture timing is at a boundary condition. In this case, the DRAM control circuitry 125 sets N to the smaller of the counted values in the WLearlyShiftA<3:0> signal 124 and the WLearlyShiftB<3:0> signal 130 and adjusts the launch of IWS to ½ a cycle earlier. In other words, the DRAM control circuitry 125 launches a half-cycle earlier than the earliest capture of IWS.

FIG. 5 illustrates a detailed embodiment of the capture circuitry 50. As illustrated, a DQS signal 142 is captured at an input buffer 144 of the memory device 10 as a DS signal 146 and a DSF signal 148. In some embodiments, the DQS signal 142 may be a differential signal composed of two other signals (e.g., DQS_t and DQS_c). The ungated DS signal 150 may be used at other points in the capture circuitry 50. The ungated DS signal 150 is a pre-gated version of the indication 60. Furthermore, the ungated DS signal 150 may be generated from the DSF signal 148 using one or more inverters 152 that may be used to amplify the ungated DS signal 150 due to potential loading due to routing and distribution of the ungated DS signal 150 in the capture circuitry 50.

Similar to the ungated DS signal 150, the capture circuitry 50 may generate an ungated DSF signal 154 using the DS signal 146. The ungated DSF signal 154 may be used at other points in the capture circuitry 50. The ungated DSF signal 154 is a pre-gated version of the indicator 62. Furthermore, the ungated DSF signal 154 may be generated from the DS signal 146 using one or more inverters 156 that may be used to amplify the ungated DSF signal 154 due to potential loading due to routing and distribution of the ungated DSF signal 154 in the capture circuitry 50.

As illustrated, the capture circuitry 50 includes an OR gate 158 and a NAND gate 160. The OR gate 158 receives the DSF signal 148 and a control from the latching circuitry 163 and outputs to the NAND gate 160. The NAND gate 160 receives the output of the OR gate 158 and receives a voltage 162 to produce the indicator 60. Using a control from latching circuitry 163 and the DSF signal 148 to control the NAND gate 160 (along with the voltage 162) causes the NAND gate 160 to invert the DSF signal 148 to generate the indication 60 when the control from the latching circuitry 163 enables passing through the capture circuitry 50 due to IWS being captured in the latching circuitry 163.

The capture circuitry 50 includes an OR gate 166 and a NAND gate 168. The OR gate 166 receives the DS signal 146 and VSS 170 and outputs to the NAND gate 168. The NAND gate 168 receives the output of the OR gate 166 and a control from the latching circuitry 171. Similar to the latching circuitry 163, using the control from the latching circuitry 171 and the DS signal 146 to control the NAND gate 168 causes the NAND gate 168 to invert the DS signal 146 to generate the indicator when the control from the latching circuitry 171 enables passing through the gating circuitry 92 due to IWS being captured in the latching circuitry 171.

Figure 6:
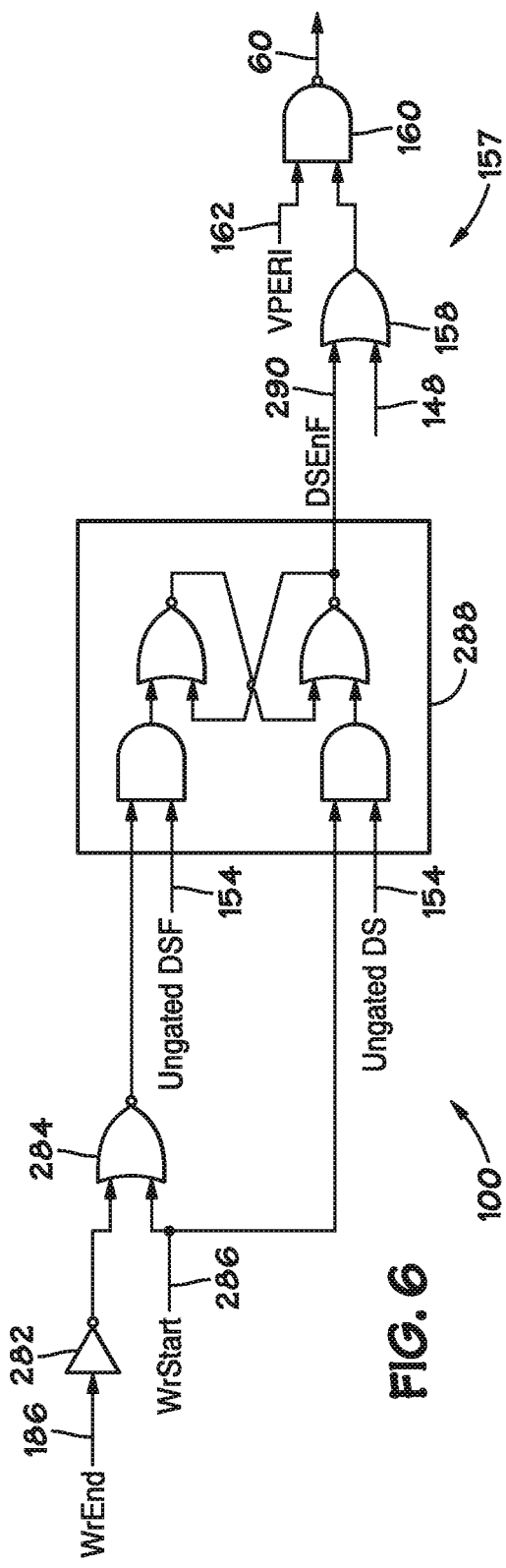
FIG. 6 is a schematic diagram of the first latching circuitry of the latching circuitries of FIG. 5, in accordance with an embodiment.

FIG. 6 is a schematic diagram of the latching circuitry 163. The latching circuitry 163 receives a WrEnd signal 186 indicating whether a write operation is ending. The latching circuitry 163 inverts the WrEnd signal 186 via an inverter 282. The latching circuitry 163 then passes the inverted WrEnd signal 186 to a NOR gate 284 along with a received WrStart signal 286 that indicates whether a write operation is starting.

The WrEnd signal 186 fires at a last rising edge of the DQS signal 142. The WrEnd signal 186 places a latch 288 in a ready state on the last rising edge (i.e., next-to-last bit of write operation). The last bit (i.e., last falling edge) is detected via the ungated DSF signal 154. The last bit triggers the latch 288 with minimal delays. In other words, when the WrStart signal 286 is simultaneously high with the ungated DSF signal 154, the latch 288 is reset to output a DSEnF signal 290 as a low enable pass-through of the gating circuitry 90 as the indicator 60. When the WrEnd signal 186 transitions high while the WrStart signal 286 is low and the ungated DSF signal 154 is high, the latch 288 is set and the DSEnF signal 290 transitions high to disable the pass-through of the capture circuitry 50.

Figure 7:
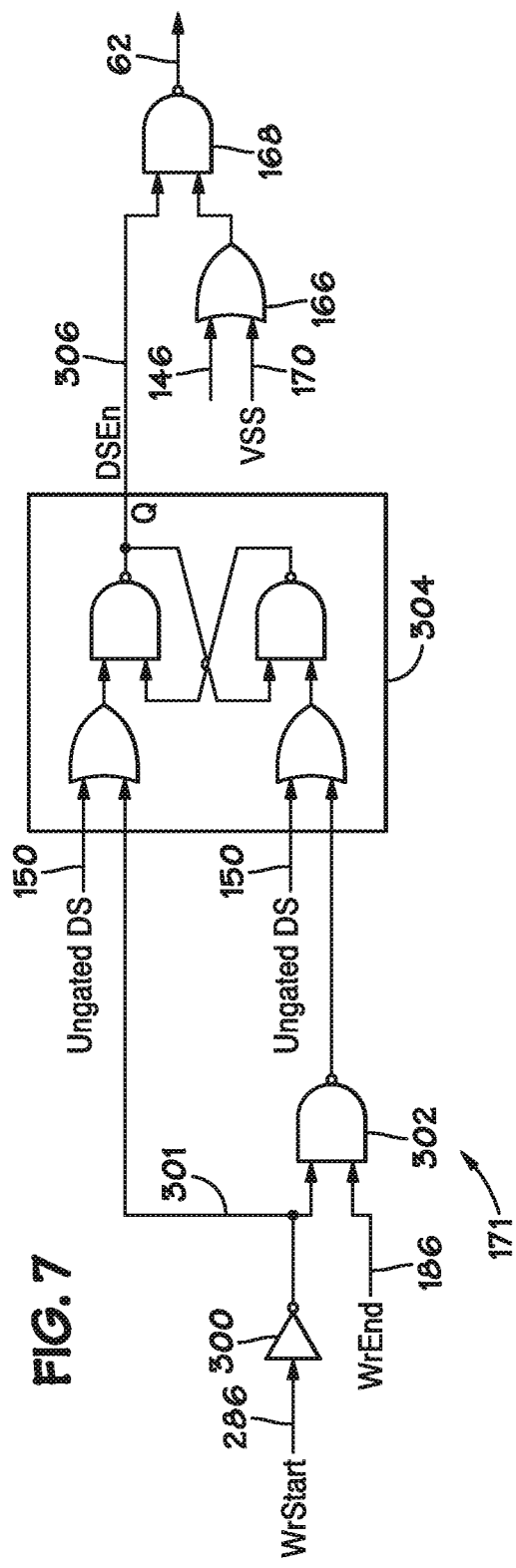
FIG. 7 is a schematic diagram of a second latching circuitry of the latching circuitries of FIG. 5, in accordance with an embodiment.

FIG. 7 is a schematic diagram of the latching circuitry 171 that works similarly to the latching circuitry 163 discussed in relation to FIG. 6 above. The latching circuitry 171 receives the WrEnd signal 186 from the counter 147. The latching circuitry 171 receives and inverts the WrEnd 286 via an inverter 300 to generate an inverted WrStart 301. The latching circuitry 171 then passes the inverted WrStart 301 to a NAND gate 302 along with the WrEnd signal 186. The latching circuitry 171 includes a latch 304 that controls the gating circuitry 92 using a DSEn signal 306 after/during the last cycle of the ungated DS signal 150 of the write operation.

In other words, the capture circuitry 50 outputs the indications 60 and 62 as logically high when the IWS is captured as the WrStart signal 286. The indication 60 indicates whether a negative side of the input buffer 144 is used to capture the IWS, and the indication 62 indicates whether a positive side of the input buffer 144 is used to capture the IWS.

Figure 8:
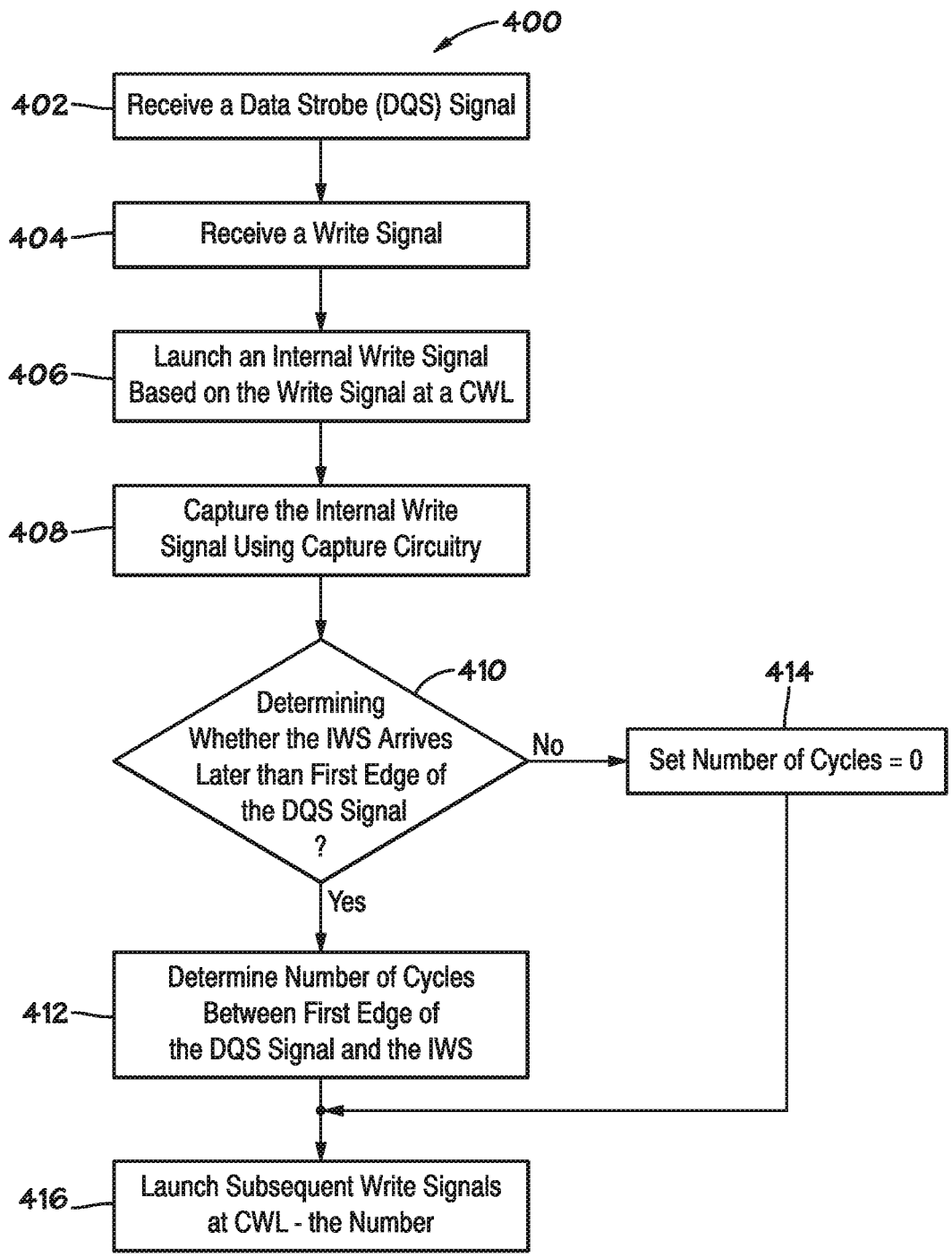
FIG. 8 is a flow diagram of a process that may be used by the IWS circuitry, in accordance with an embodiment.

FIG. 8 illustrates a flow diagram of an embodiment of a process 400 that may be used by the memory device 10 with the IWS circuitry 49. The memory device 10, via the I/O interface 16, receives the DQS signal (block 402). The memory device 10, via the command interface 14, receives the write signal (block 404). For example, the first write operation may be a part of a write leveling operation used to set timing between the controller 17 and the memory device 10. The DRAM control circuitry 125 launches an IWS based on the write signal after CWL has elapsed (block 406). The capture circuitry 50 captures the IWS using the capture circuitry 50 (block 408). In response to the capture, the capture circuitry 50 outputs an indication of capture. Based on the output, the DRAM control circuitry 125 and/or the calculation circuitry 52 determines whether the IWS arrives later than a first edge of the DQS signal (block 410). For example, if a counter in the calculation circuitry 52 is a non-zero value, the IWS arrives later than the first edge of the DQS signal. If the IWS arrives later than the first edge of the DQS signal, the DRAM control circuitry 125 and/or the calculation circuitry 50 determines a number of cycles between the first edge of the DQS signal and the IWS (block 412). For example, if only a single counter is included in the calculation circuitry 52, the number of cycles is the value counted in the counter. Additionally or alternatively, if two counters are included and have the same value, the number of cycles is the value of the two counters. However, if the two counters have different values, the number of cycles may be set to a lowest value in the two counters minus half a cycle. If the IWS does not arrive later than the first edge of the DQS signal, the counter(s) may contain a zero value. Accordingly, the number of cycles may be set to 0 (block 414). The DRAM control circuitry 125 launches subsequent write signals at CWL minus the number of cycles to synchronize the IWS with the first edge of the DQS signal (block 416).

Although the foregoing discusses various logic-low and/or logic-high assertion polarities, at least some of these polarities may be inverted in some embodiments. Furthermore, in some embodiments, logic gates as discussed herein may be replaced with similar logical functions, such as an inverter replaced with a single NAND gate or other similar changes.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
    capture circuitry configured to:
        capture a write signal from a host device using a data strobe signal from the host device, wherein the capture circuitry comprises an input buffer that receives the data strobe signal and outputs positive and negative outputs from the data strobe signal; and
        output one or more indications of capture of the write signal via the input buffer; and
    calculation circuitry configured to:

receive the data strobe signal;
receive the one or more indications of capture; and
determine a delay between a first edge of the data strobe signal and receipt of the one or more indications of capture; and
transmission and control circuitry configured to launch subsequent write signals at a time based at least in part on the delay.

2. The memory device of claim 1, wherein the transmission and control circuitry comprises dynamic random-access memory (DRAM) control circuitry configured to launch the subsequent write signals based at least in part on the delay and a cas write latency (CWL) for the memory device.

3. The memory device of claim 2, wherein the transmission and control circuitry is configured to launch the subsequent write signals after a number of cycles corresponding to the CWL minus the delay.

4. The memory device of claim 1, wherein the write signal is received as part of a write leveling operation between the memory device and a host controller.

5. The memory device of claim 1, wherein a first capture path of capture paths is configured to use the positive output of the input buffer to capture the write signal, and a second capture path of the capture paths is configured to use the negative output of the input buffer to capture the write signal.

6. The memory device of claim 1, wherein the calculation circuitry comprises counters each corresponding to a respective capture path.

7. The memory device of claim 6, wherein the transmission and control circuitry is configured to receive values from each of the counters, and set the values from the counters as the delay when the values are equal.

8. The memory device of claim 6, wherein the transmission and control circuitry is configured to receive values from each of the counters, and set the delay as a lower value of the values minus half a cycle when the values are not equal.

9. A method, comprising:
receiving a data strobe (DQS) signal at a memory device from a controller;
receiving a write signal at the memory device from the controller;
launching an internal write signal based on the write signal at a cas write latency (CWL) for the memory device;
capturing the write signal using capture circuitry;
determining whether the internal write signal arrives later than a first edge of the DQS signal using counters, wherein a first counter of the counters uses a first capture indicator from a first portion of the capture circuitry, and a second counter of the counters uses a second capture indicator from a second portion of the capture circuitry;
when the internal write signal arrives later than the first edge of the DQS signal, determining a number of cycles between the first edge of the DQS signal and the internal write signal; and
for subsequent write operations, launching the internal write signal at the CWL minus the number of cycles.

10. The method of claim 9, wherein the write signal is received as part of a write leveling operation between the memory device and the controller.

11. The method of claim 10, wherein the write leveling operation is initiated after startup of the memory device.

12. The method of claim 9, wherein determining whether the internal write signal arrives later than the first edge of the DQS and determining the number of cycles between the first edge of the DQS signal and the internal write signal is performed entirely within the memory device.

13. The method of claim 9, wherein determining the number of cycles between the first edge of the DQS signal and the internal write signal comprises receiving different numbers via different counters of the counters.

14. The method of claim 13, comprising setting the number to a lesser value of the different numbers minus 0.5 cycles.

15. The method of claim 9, wherein the first portion of the capture circuitry captures the write signal using a positive output of an input buffer receiving the DQS signal, and the second portion of the capture circuitry captures the write signal using a negative output of the input buffer.

16. A semiconductor device, comprising:
capture circuitry configured to capture a write signal from a host device using a data strobe signal and to output an indication of capture of the write signal in the capture circuitry, wherein the capture circuitry comprises an input buffer that receives the data strobe signal and outputs positive and negative outputs from the data strobe signal;
calculation circuitry configured to receive the outputs from the data strobe signal and the indication of capture, wherein the calculation circuitry comprises a counter that is configured to count out a delay between a first edge of the data strobe signal and receipt of the indication of capture; and
transmission and control circuitry configured to receive an indication of the delay from the calculation circuitry and to launch subsequent write signals at a time based at least in part on the delay.

17. The semiconductor device of claim 16, wherein the counter comprises a ripple counter.

18. The semiconductor device of claim 16, wherein the transmission and control circuitry comprises dynamic random-access memory (DRAM) control circuitry configured to launch the subsequent write signals based at least in part on the delay and a cas write latency (CWL) for the semiconductor device.

* * * * *